(12) United States Patent
Garcia et al.

(10) Patent No.: US 7,421,778 B2
(45) Date of Patent: Sep. 9, 2008

(54) METHOD OF MAKING AN ELECTRONIC ASSEMBLY

(75) Inventors: Jason A. Garcia, Chandler, AZ (US); John J. Beatty, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 186 days.

(21) Appl. No.: 11/388,100

(22) Filed: Mar. 22, 2006

(65) Prior Publication Data

US 2006/0162959 A1     Jul. 27, 2006

Related U.S. Application Data

(62) Division of application No. 10/883,433, filed on Jun. 30, 2004, now Pat. No. 7,183,493.

(51) Int. Cl.
*H05K 3/36* (2006.01)
(52) U.S. Cl. .............................. 29/830; 29/842; 29/843; 29/874; 29/884
(58) Field of Classification Search .................. 29/842, 29/843, 874, 884, 830
See application file for complete search history.

(56) References Cited

U.S. PATENT DOCUMENTS

| 6,029,344 | A | 2/2000 | Khandros et al. |
| 6,274,823 | B1 | 8/2001 | Khandros et al. |
| 6,330,164 | B1 | 12/2001 | Khandros et al. |
| 6,606,434 | B1 * | 8/2003 | Suhir ............................ 385/51 |
| 6,640,432 | B1 * | 11/2003 | Mathieu et al. ................ 29/842 |
| 8,866,255 | | 3/2005 | Fork et al. |
| 7,127,811 | B2 * | 10/2006 | Mathieu et al. ............... 29/846 |

OTHER PUBLICATIONS

Amendment & Response filed Aug. 30, 2006. U.S. Appl. No. 10/833,433, Filed Jun. 30, 2004.
Office Communication mailed May 30, 2006, U.S.Appl. No. 10/833,433, Filed Jun. 30, 2004, Confirmation No. 3581.

* cited by examiner

*Primary Examiner*—C. J Arbes
(74) *Attorney, Agent, or Firm*—Blakely, Sokoloff, Taylor & Zafman LLP

(57) ABSTRACT

According to one aspect of the invention, an electronic assembly is provided. The electronic assembly includes a first substrate having an integrated circuit formed therein and a second substrate. The first and second substrates are interconnected by a plurality of bi-material interconnects that are electrically connected to the integrated circuit and have a first component comprising a conductive first material with a first coefficient of thermal expansion and a second component comprising a second material with a second coefficient of thermal expansion. The first and second components are connected and shaped such that when the temperature of the bi-material interconnects changes the interconnects each bend towards the first or second component. When the temperature of the second substrate increases, the second substrate expands away from a central portion thereof. The bi-material interconnects are arranged such that the bi-material interconnects bend away from the central portion of the second substrate.

5 Claims, 22 Drawing Sheets

METHOD OF MAKING AN ELECTRONIC ASSEMBLY

This is a Divisional Application of Ser. No. 10/883,433 filed Jun. 30, 2004 now U.S. Pat. No. 7,183,493.

BACKGROUND OF THE INVENTION

1). Field of the Invention

Embodiments of this invention relate to an electronic assembly, and more particularly, how electrically connections are made between various components of the electronic assembly.

2). Discussion of Related Art

Integrated circuits are formed on semiconductor wafers. The wafers are then sawed (or "singulated" or "diced") into microelectronic dice, also known as semiconductor chips, with each chip carrying a respective integrated circuit. Each semiconductor chip is then mounted to a package, or carrier, substrate, thereby forming a semiconductor package. Often the packages are then mounted to a motherboard, which may then be installed into a computing system.

The package substrates provide structural integrity to the semiconductor chips and are used to connect the integrated circuits electrically to the motherboard. Ball Grid Array (BGA) solder ball contact formations are formed on one side of the package substrate and are soldered to the motherboard. Electric signals are sent through BGA formations into and out of the package.

Smaller solder contact formations, such as controlled-collapse chip connections (C4) contact formations, are formed on the microelectronic die and are attached to an opposing side of the package substrate. The electric signals are sent between the package and the microelectronic die through the C4 contact formations.

The package substrate typically has a coefficient of thermal expansion (CTE) that is four or five times greater than the CTE of the die. So that the package expands at a much faster rate than the die when heat is generated as the die is powered up. Differential expansion between the die and the package substrate increases the mechanical stress on the contact formations, which can lead to the contact formation becoming separated from either the die or the package substrate and failure of the package.

BRIEF DESCRIPTION OF THE DRAWINGS

Embodiments of the invention are described by way of examples with reference to the accompanying drawings, wherein.

DETAILED DESCRIPTION OF THE INVENTION

FIG. 1A to FIG. 10 illustrate an electronic assembly including a first substrate having an integrated circuit formed therein and a second substrate. The first and second substrates are interconnected by a plurality of bi-material interconnects, or contact formations, that are electrically connected to the integrated circuit and have a first component comprising a conductive first material with a first coefficient of thermal expansion and a second component comprising a second material with a second coefficient of thermal expansion. The first and second components are connected and shaped such that when the temperature of the bi-material interconnects changes the interconnects each bend towards the first or second component. When the temperature of the second substrate increases, the second substrate expands away from a central portion thereof. The bi-material interconnects are arranged such that the bi-material interconnects bend away from the central portion of the second substrate.

It should be understood that FIGS. 1A-10 are merely illustrative and may not be drawn to scale.

Figure 1A:
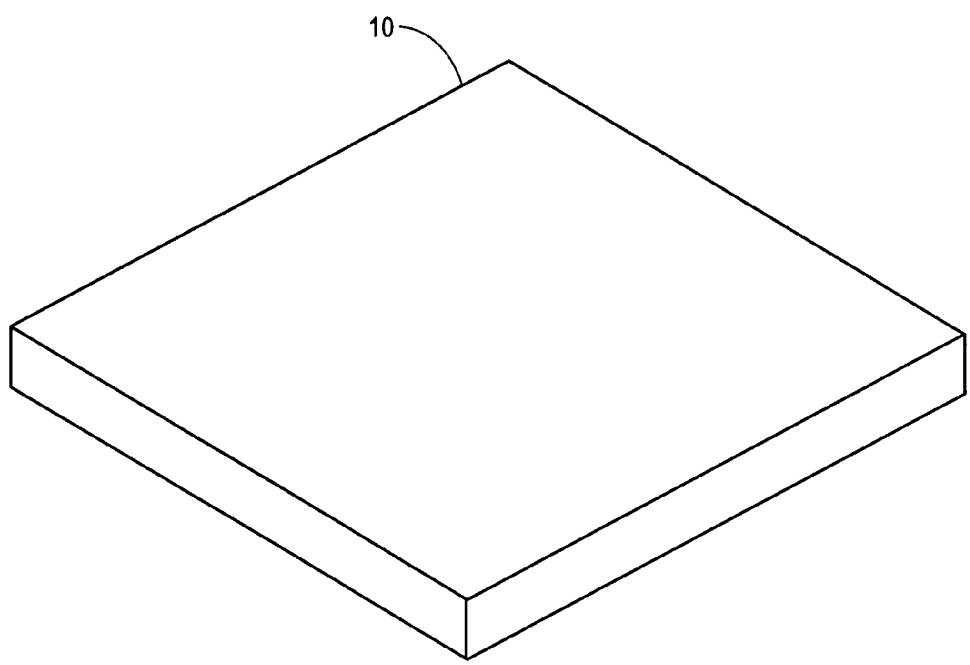
FIG. 1A is a perspective view of a release film substrate.

FIG. 1A illustrates a release film substrate 10. Although as illustrated, the release film substrate 10 is substantially square, it should be understood that the release film substrate may only be a portion of a larger wafer, as is commonly understood in the art.

Figure 1B:
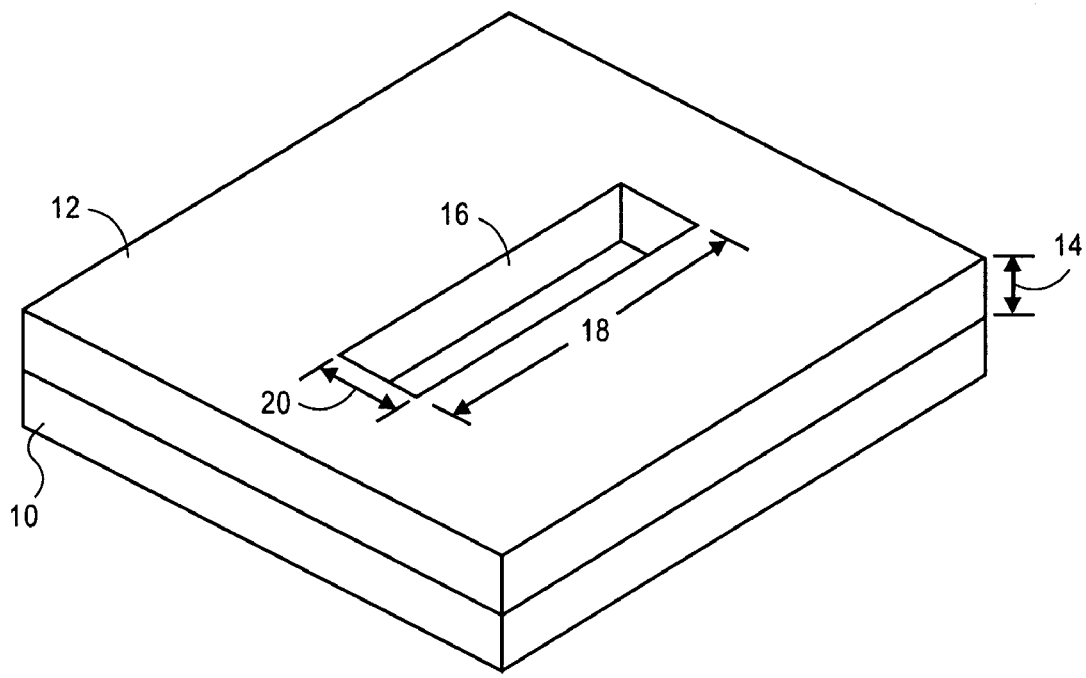
FIG. 1B is a perspective view of the release film substrate with a first release film formed thereon.

FIG. 1B illustrates the release film substrate 10 with a first release film 12 formed thereon. The first release film 12 is made of photoresist and has a thickness 14 of 0.5 mils. A first component trench 16 has been formed in the first release film 12. The first component trench 16 has a length 18 of 12 mils and a width 20 of 1 mil. The first component trench 16 is formed in the first release film 12 after the first release film 12 is formed on the release film substrate 12 using photolithographic development as is commonly understood in the art.

Figure 1C:
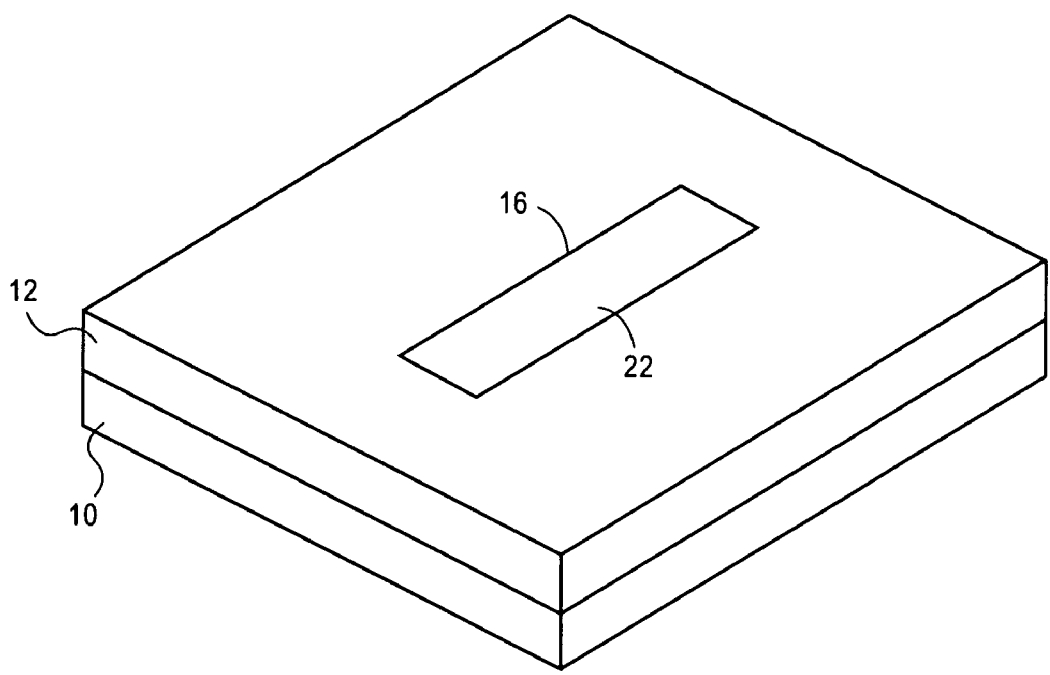
FIG. 1C is a perspective view of the release film substrate with a first component formed within the first release film.

FIG. 1C illustrates the release film substrate 10 with a first component 22 formed within the first component trench 16 in the first release film 12. The first component 22 is made of aluminum and is formed using electroplating. Aluminum has a linear CTE of $24 \times 10^{-6}/°$ C.

Figure 1D:
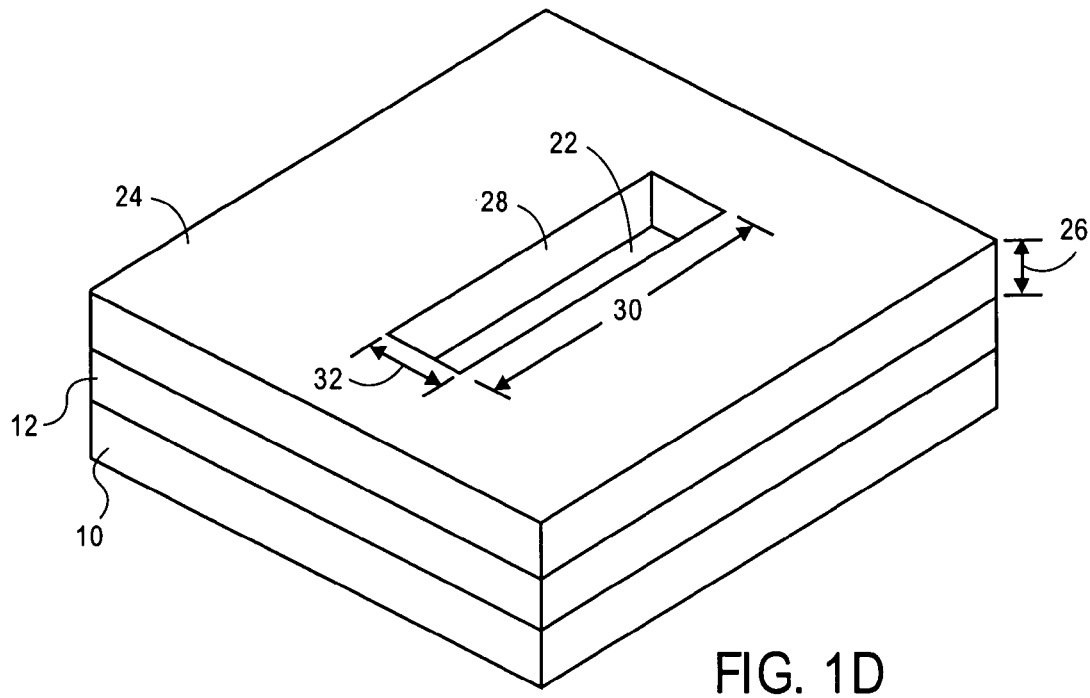
FIG. 1D is a perspective view of the release film substrate with a second release film formed thereon.

FIG. 1D illustrates the release film substrate 10 with a second release film 24 formed over the first release film 12. The second release film 24 is made of photoresist and has a thickness 26 of 0.5 mils. A second component trench 28 has been formed in the second release film 24 directly over the first component trench 16 and the first component 22. The second component trench 28 has a length 30 of 12 mils and a width 32 of 1 mil.

Figure 1E:
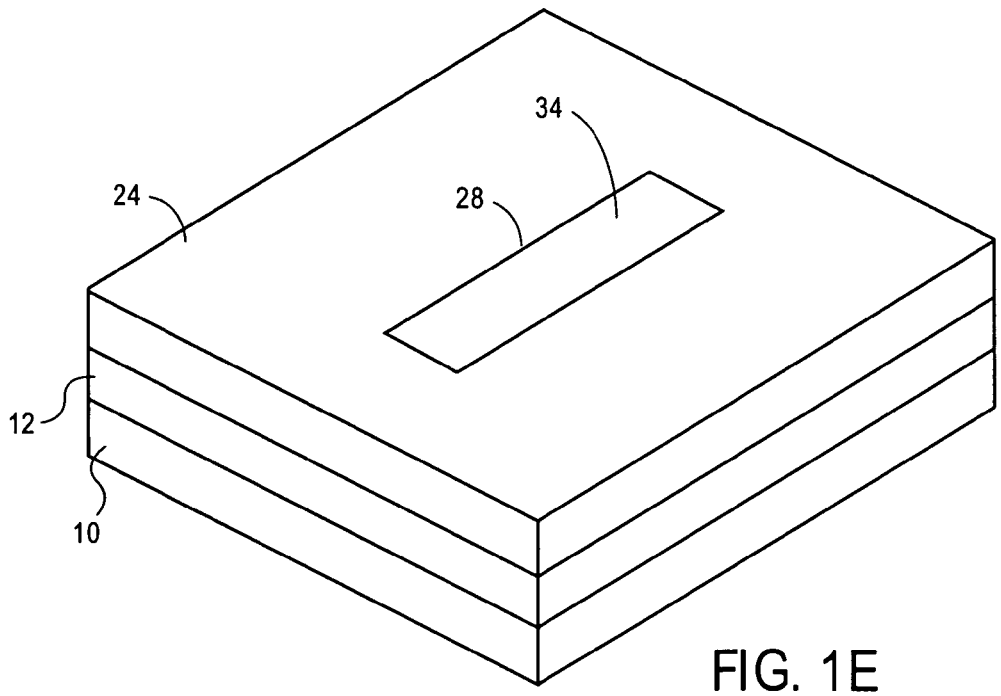
FIG. 1E is a perspective view of the release film substrate with a second component formed within the second release film.

FIG. 1E illustrates the release film substrate 10 with a second component 34 formed within the second component trench 28 in the second release film 24. The second component 34 is made of copper and is formed using electroplating. Copper has a linear CTE of $17 \times 10^{-6}/°$ C.

Figure 1F:
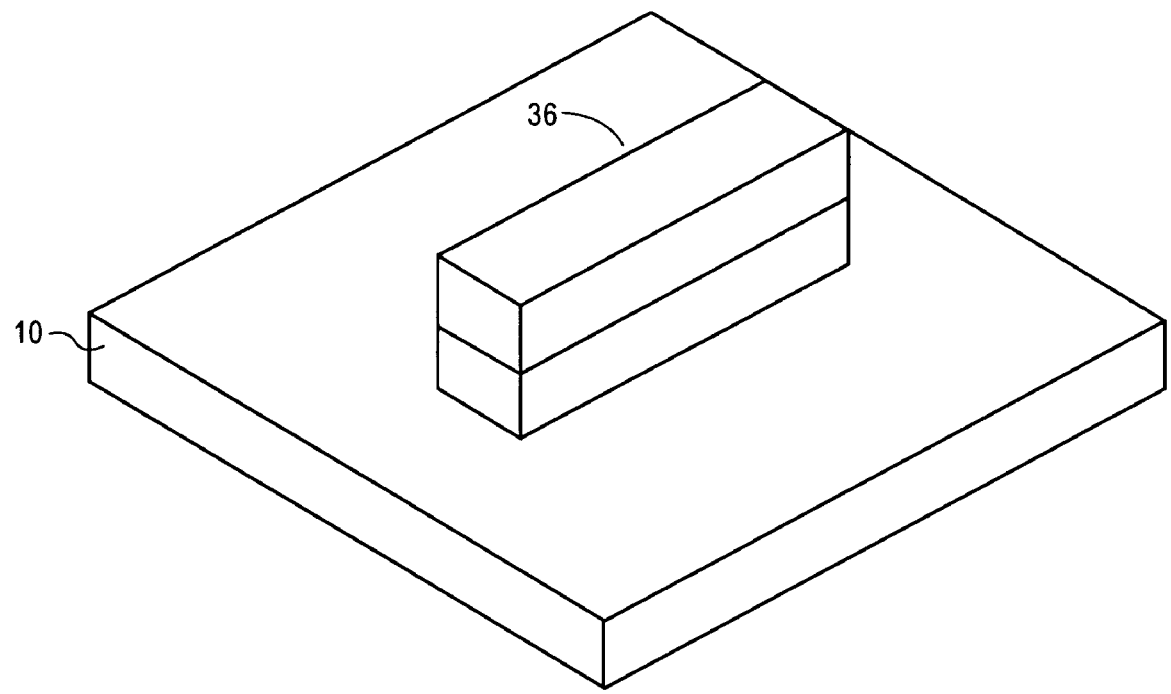
FIG. 1F is a perspective view of the release film substrate after the first and second release films have been removed.

FIG. 1F illustrates the release film substrate 10 with the first 12 and second 24 release films removed from the release film substrate 10. A bi-metal interconnect 36 now lies on the release film substrate 10.

Figure 1G:
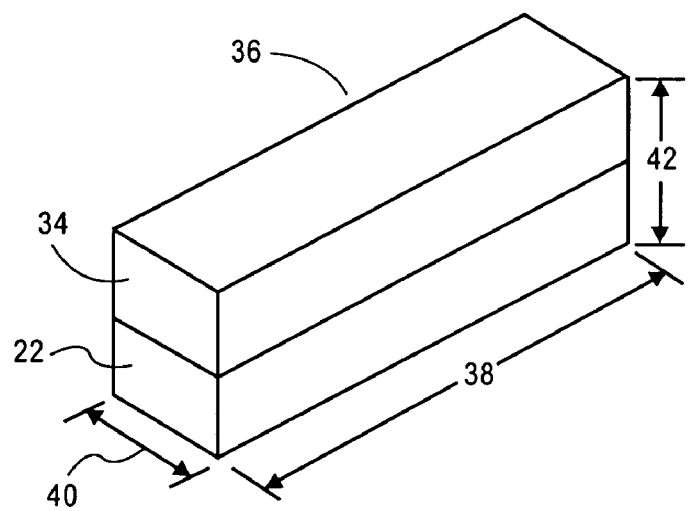
FIG. 1G is a perspective view of a bi-material interconnect.

FIG. 1G illustrates the bi-metal interconnect 36 having been removed from the release film substrate 10. The bi-metal interconnect is substantially rectangular, includes the first component 22 and the second component 34, and has a length 38 of 12 mils, a width 40 of 1 mil, and a thickness 42 of 1 mil. The length 38 may also be, for example, between 4 mils and 12 inches. The width 40 and the thickness 42 may be, for example, between 0.5 and 3 mils.

FIGS. 2A through 2F illustrate a method of securing the bi-metal interconnect 36 to a microelectronic die 44 using a wire bonding technique.

Figure 2A:
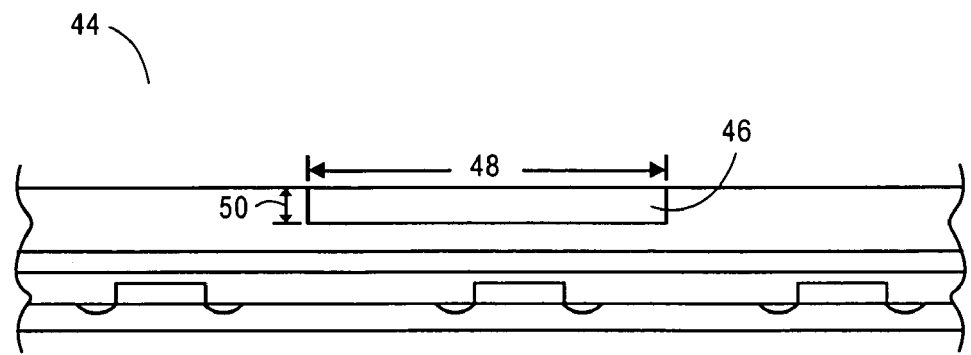
FIGS. 2A-2E are cross-sectional side views of a microelectronic die illustrating a method for attaching the bi-material interconnect thereto.

FIG. 2A illustrates the microelectronic die 44. The die 44 includes an integrated circuit, such as a microprocessor, formed therein, which includes multiple transistors and has a thickness of approximately 0.7 mm. The die 44 also includes a plurality of alternating insulating and conducting layers, as is commonly understood in the art and illustrated in FIG. 2A. The die 44 is a portion of a semiconductor wafer, typically made of silicon, having a plurality of the integrated circuits formed thereon separated amongst a plurality of dice 44. The die 44 also includes a bonding pad 46 formed within a lower (as illustrated, the die 44 is upside-down) surface thereof. The bonding pad 46 is made of copper and formed using electroplating. The bonding pad is substantially square with a width 48 of approximately 2 mils and a thickness 50 of approximately 0.25 mils. Although not illustrated in detail, it should be understood that the bonding bad 46 is electrically connected to the integrated circuit within the die 44. The combination of the different materials within the die 44 gives the die 44 a linear CTE of approximately $4 \times 10^{-6}/°$ C.

Figure 2B:
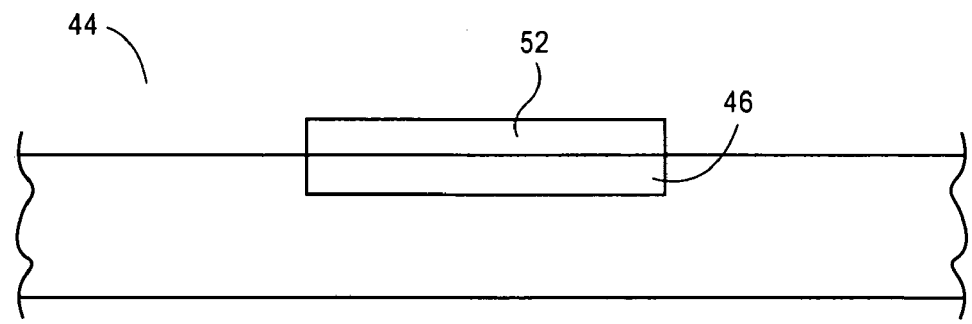

FIG. 2B illustrates the die 44 with a solder paste 52 deposited over the bonding pad 46. The solder paste is made of lead and tin and deposited using solder stenciling.

Figure 2C:
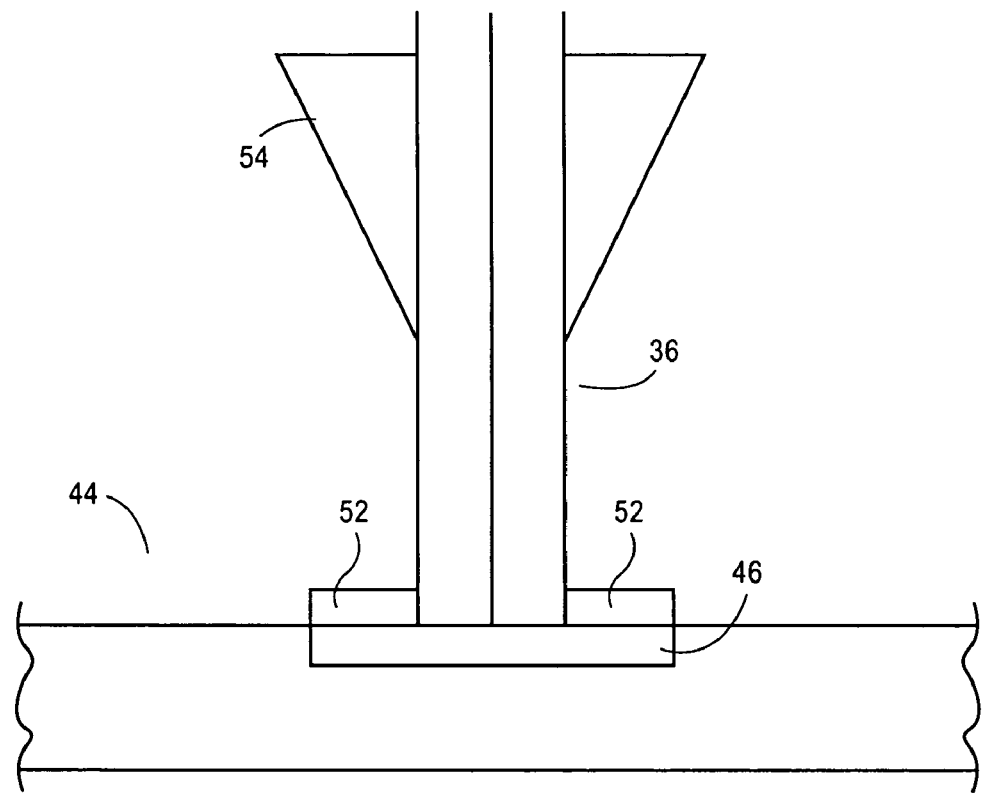

FIG. 2C illustrates the die 44 with the interconnect 36 having been placed into the solder paste 52 using a wire bonding head 54. A lower end of the interconnect directly contacts the bonding pad 46 and is now electrically connected to the integrated circuit within the die 44.

Figure 2D:
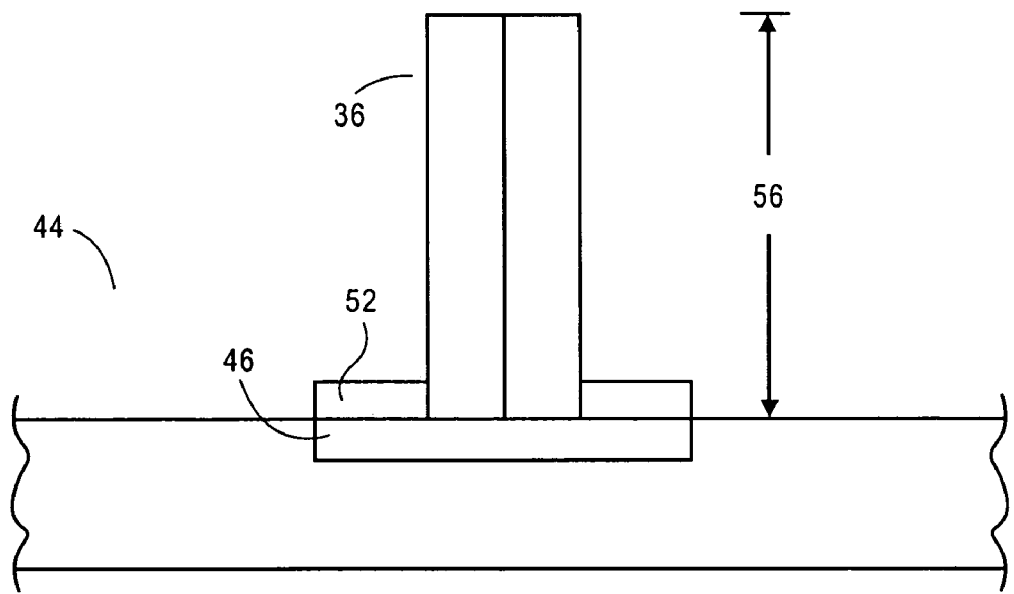

FIG. 2D illustrates the die 44 after the wire bonding head 54 has released the interconnect 36. The interconnect 36 has also been cut down to an interconnect height 56 of approximately 6 mils. The height 56 may be, for example, between 4 and 10 mils.

Figure 2E:
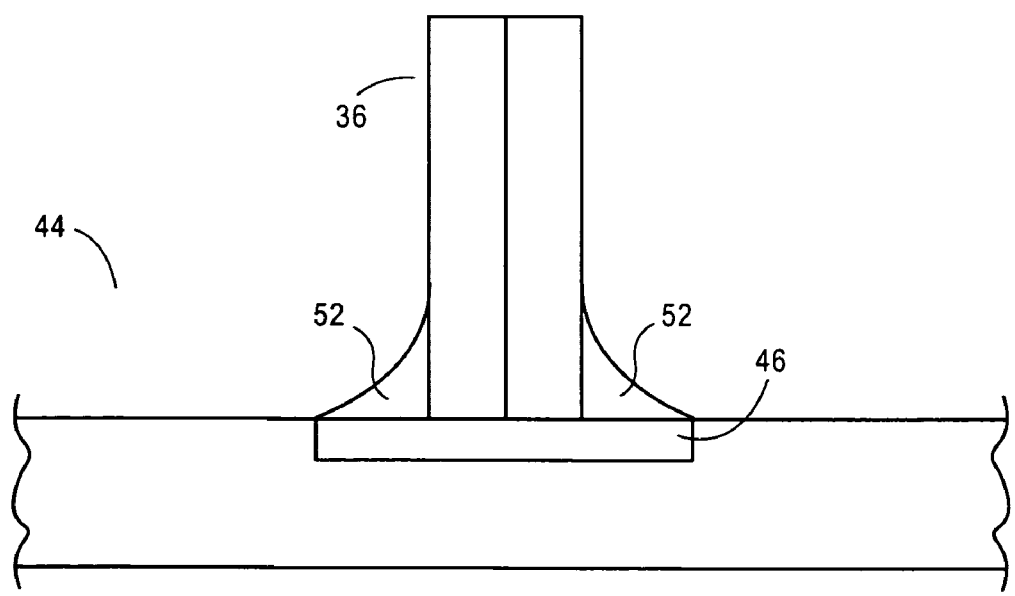

FIG. 2E illustrates the die 44 after the solder paste 52 has been heated to reflow. The bi-metal interconnect 36 is now secured to the die 44.

Figure 2F:
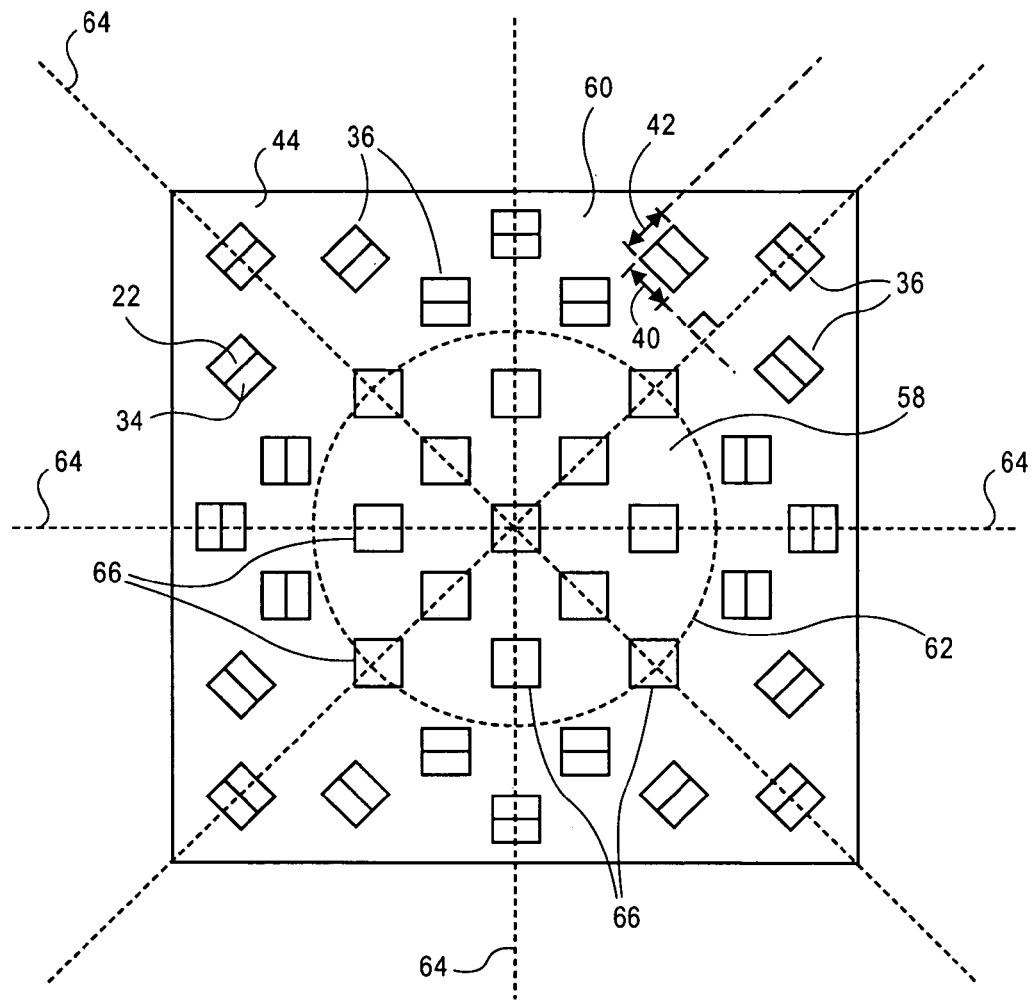
FIG. 2F is a bottom view of the microelectronic die.

FIG. 2F illustrates the entire die 44 after multiple bi-metal interconnects 36 have been attached to the lower surface thereof. As illustrated, the lower surface of the die 44 includes a first portion 58 and a second portion 60. As is discussed below, the first 58 and second portion 60 may also be construed as corresponding portions of the die 44 itself and a package substrate. The first portion 58 is substantially circular in shape and lies at a central portion of the of the die 44. The second portion 60 lies at an outer portion of the die 44 around the first portion 58. The first 58 and second 60 portions of the lower surface are separated by a critical stress radius 62. As is discussed in more detail below, the first 58 and second 60 portions of the lower surface of the die 44 represent regions of different levels of mechanical stress on the interconnects while the die 44 is attached to a package substrate during use.

Still referring to FIG. 2F, the bi-metal interconnects 36 are connected to the lower surface of the die 44 on the second portion 60. The bi-metal interconnects are 36 arranged such that the widths 40 of the bi-metal interconnects 36 extend in a direction that is substantially perpendicular to lines 64 extending radially from the critical stress radius 62 while the thickness 42 of the bi-material interconnects 36 substantially parallel to the lines 64. That is, the second component 34 of each bi-metal interconnect 36 lies substantially directly between the first portion 58 of the lower surface of the die 44 and the first component 22 of that particular interconnect 36. The lines 64 intersect at a neutral point at the center of the die 44. The second components 34 are thus on the inside and the first components 22 are on the outside with respect to the neutral point.

Still referring to FIG. 2F, single metal interconnects 66 have been attached to the first portion 58 of the lower surface of the die 44. The single metal interconnects 66 are of approximately the same size and shape as the bi-metal interconnects 36 and are attached to the die 44 using a similar technique to that illustrated in FIGS. 2A-2E. The single metal interconnects 66 are made of copper.

Although as illustrated, the die 44 has several dozen interconnects attached thereto, it should be understood that there may be literally hundreds of such interconnects. It should also be understood that each of the interconnects lies directly over a bonding pad as illustrated in FIG. 2E.

Figure 3:
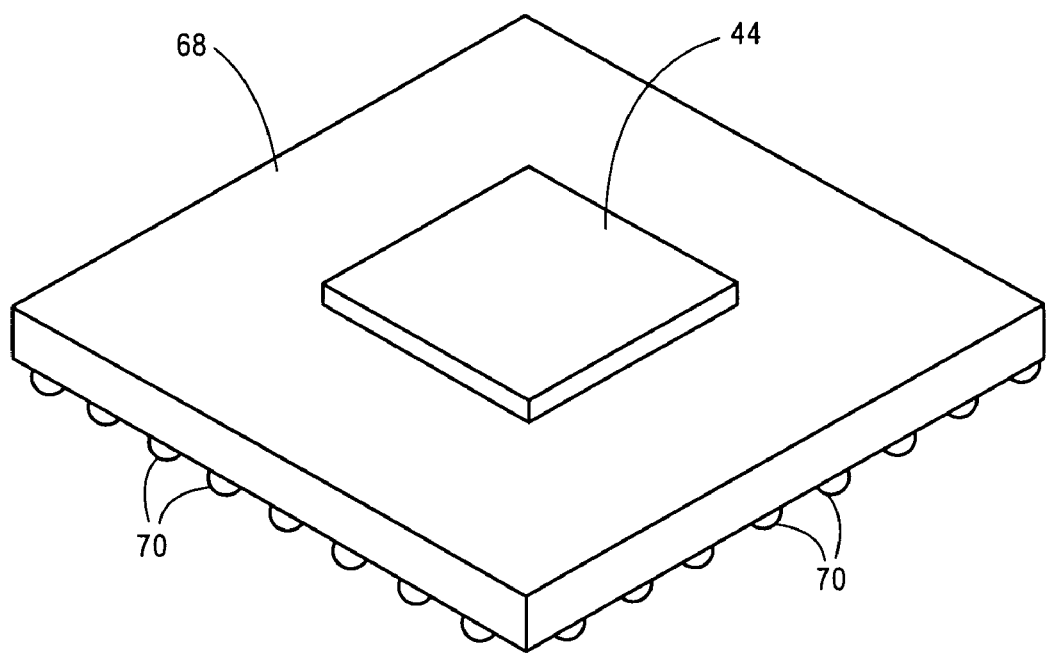
FIG. 3 is a perspective view of a package substrate with the die attached to an upper surface thereof.
Figure 5A:
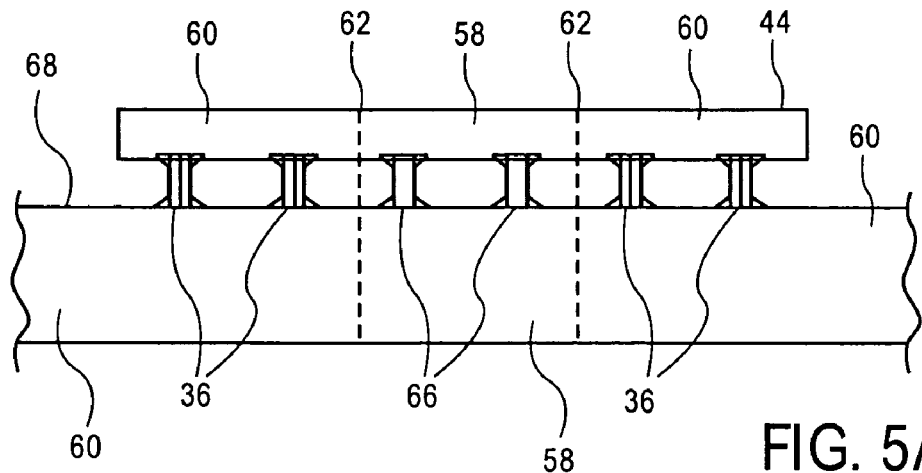
FIGS. 5A-5C are cross-sectional side views of the package substrate and the microelectronic die.

FIGS. 3 and 5A illustrate a package substrate 68 with one of the die 44 attached to a top surface at a central portion thereof. The package substrate 68 includes a plurality of solder ball contact formations 70 formed on a bottom surface thereof. The package substrate 68 is square with, for example, side lengths of 3 cm and a thickness of 3 mm. The package substrate 68 has alternating conducting and insulating layers therein, as is commonly understood in the art. The combination of the different materials in the package substrate gives the package substrate 68 a linear CTE of approximately $18 \times 10^{-6}/°$ C. As previously discussed the package substrate has first 58 and second portions 60 that correspond to the first and second portions of the die 44. The first portion 58 of the die 44 and the package substrate 68 lies within the critical stress radius 62. The second portion 60 of the die 44 and the package substrate 68 lies outside of the critical stress radius 62.

Figure 4:
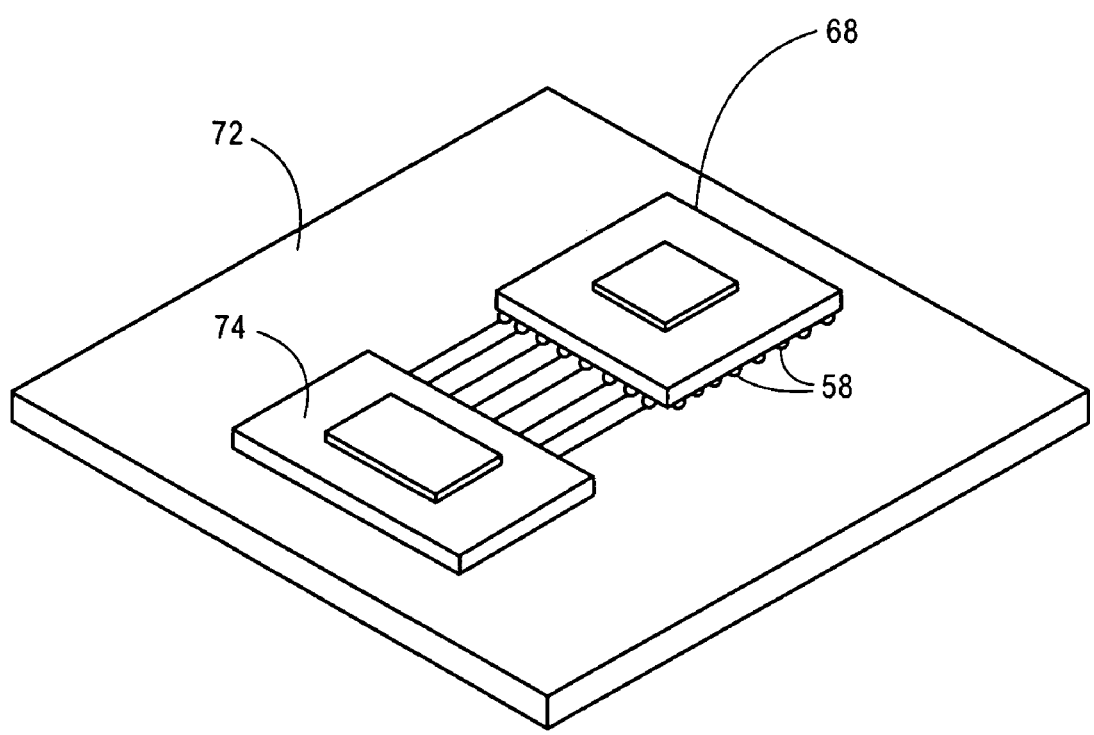
FIG. 4 is a perspective view of a printed circuit board with the package substrate attached thereto.

FIG. 4 illustrates a printed circuit board 72, such as a motherboard, with the package substrate 68 attached thereto forming an electronic assembly. The motherboard 72 is a large substrate having a plurality of sockets for securing and providing electric signals to various package substrates, microelectronic dice, and other electronic devices 74, such as memory chips, as well as conductive traces to electrically connect such devices, as is commonly understood in the art. Although not illustrated in detail, the solder balls 58 have been heated and have bonded to one of the sockets on the motherboard 72.

In use, the motherboard 72 is installed in a computing system. Electric signals such as input/output (IO) signals, are then sent from the integrated circuit within the die 44 through the interconnects 36 and 66, into the package substrate 68, and into the computing system through the printed circuit board 72. The computing system may send similar, or different, signals back to the integrated circuit within the die 44 through the motherboard 72, the package substrate 68, and the interconnect 36 and 66.

In use, power is provided through the package substrate 68 to the integrated circuit in the die 44 so that heat is generated throughout the die 44 and the package substrate 68. Because of the package substrate 68 has a considerably higher coefficient of thermal expansion than the die 44, the package substrate 68 expands at a faster rate than the die 44.

FIG. 5A illustrates the package substrate 68 and the die 44 before being powered up. As illustrated, the interconnects 36 and 66 are all substantially straight, as little or no heat has been generated within the die 44 and the package substrate 68 and thus the die 44 and the package substrate 68 have not shown any appreciable expansion.

Referring again to FIG. 2F, the mechanical stress on the interconnects 36 and 66 increases in directions parallel to lines 64 as the package substrate 68 expands more quickly than the die 44.

Figure 5B:
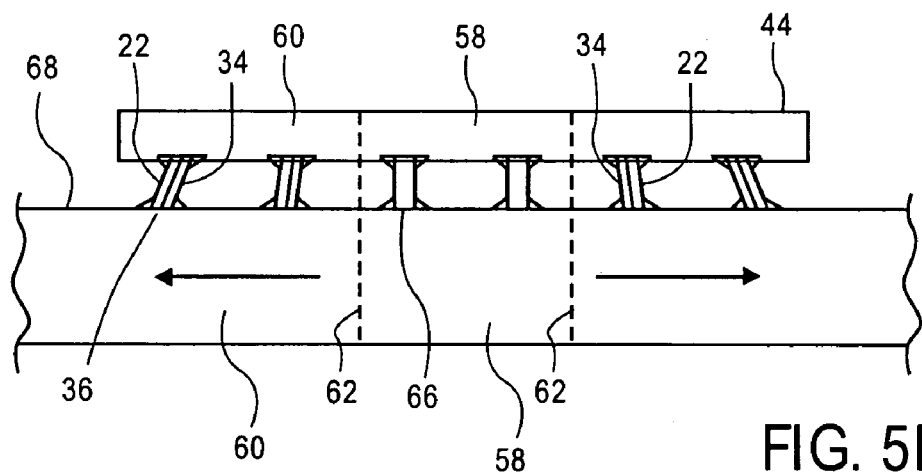

Referring now to FIG. 2F in combination with FIG. 5B, the package substrate 68 expands relative to the die 44 along lines 64, away from the critical stress radius 62. The second portion 60 of the die 44 expands more, or further, than the first portion 58. The first portion 58 undergoes very little appreciable expansion relative to the die 44, and there is virtually no expansion of the package substrate 68 relative to the die 44 at the neutral point where the lines 64 intersect.

At the same time, while the temperature of the bi-metal interconnects 36 increases, the first components 22 the bi-metal interconnects 36 expand more rapidly than the second components 34 because the first component 22 has a higher coefficient of thermal expansion than the second component 34. Therefore, the bi-metal interconnects "bend" in directions substantially parallel to lines 64, away from the critical stress radius 62. Because the bi-metal interconnect are "bending" with the expanding package substrate 68, the amount of stress on the interconnects is reduced as heat generates and temperature increases throughout the assembly.

Figure 5C:
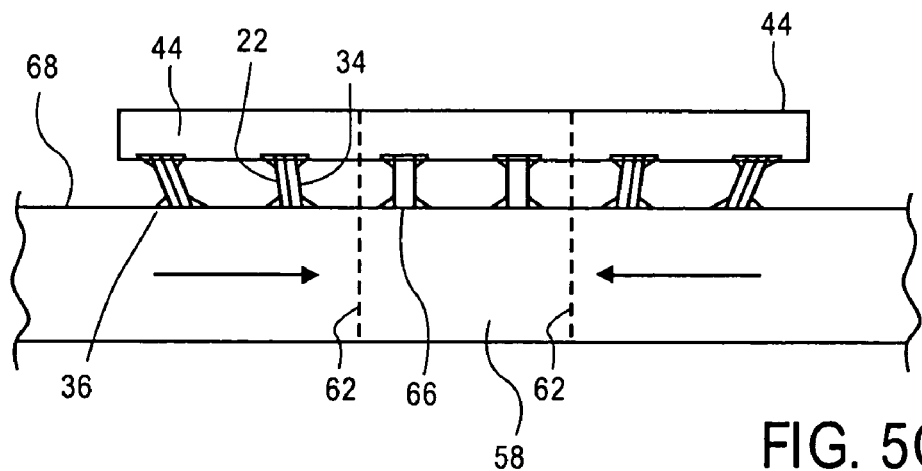

FIG. 2F in combination with FIG. 5C illustrate the assembly when the assembly is allowed to cool, such as when it is no longer in use. Because the CTE of the package substrate 68 is considerably higher than the CTE of the die 44, the package substrate 68 shrinks relative to the die 44 along lines 64, towards from the critical stress radius 62. The second portion 60 of the package substrate 68 shrinks more than the first portion 58, while at the neutral point where the lines 64 intersect, the package substrate 68 essentially does not shrink at all relative to the die 44.

At the same time, while the temperature of the bi-metal interconnects 36 decreases, the first components 22 the bi-metal interconnects 36 shrink more rapidly than the second components 34 because the first component 22 has a higher CTE than the second component 34. Therefore, the bi-metal interconnects bend in directions substantially parallel to lines 64, towards the critical stress radius 62. Because the bi-metal interconnect are bending with the expanding package substrate 68, the amount of stress on the interconnects is reduced as the temperature throughout the assembly decreases.

During both the heating and cooling cycles, as mentioned previously, the package substrate 68, within the first portion 58, changes very little in size relative to the die 44 within the first portion 58. Therefore, because the single metal interconnects 66 lie within the critical stress radius 62, the mechanical stress on the single metal interconnects 66 does not significantly increase with changes in temperature. However, it should be noted that the amount of stress on the majority of the single metal interconnects 66 is at least slightly increased during heating and cooling. Because the single metal interconnects 66 are made of a single material, the single metal interconnects remain substantially straight during both heating and cooling of the assembly.

One advantage is that because of the bending action of the bi-metal interconnects during heating and cooling, the mechanical stress on junctions between the bi-metal interconnects, the die, and the package is reduced and the likelihood of one of the interconnects losing its electrical connection to either the die or the package substrate is reduced. Therefore, a more reliable electronic assembly is provided.

FIGS. 6A through 7B illustrate a method for forming a tri-metal interconnect on a microelectronic die 80. It should be understood that like the die 44 illustrated in FIG. 2A, the die 80 illustrated in FIGS. 6A through 7B has an integrated circuit formed therein and multiple bonding pads 82 thereon that are electrically connected to the integrated circuit.

Figure 6A:
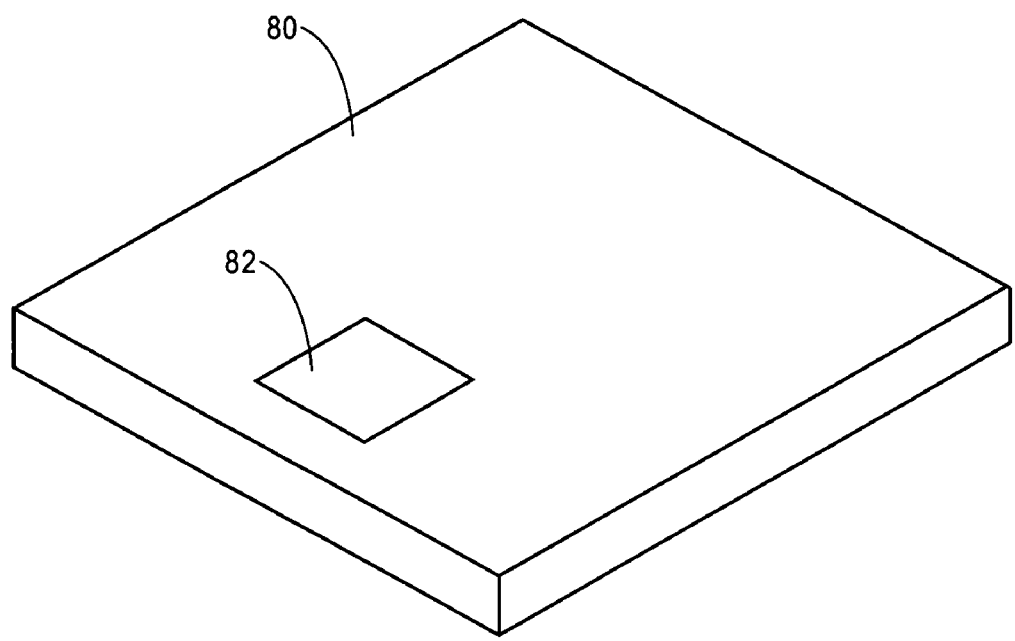
FIG. 6A is a perspective view of a microelectronic die.

FIG. 6A illustrates a portion the microelectronic die 80. The die 80 is similar to the die 44 illustrated in FIG. 2A and also has a bonding pad 82 formed thereon.

Figure 6B:
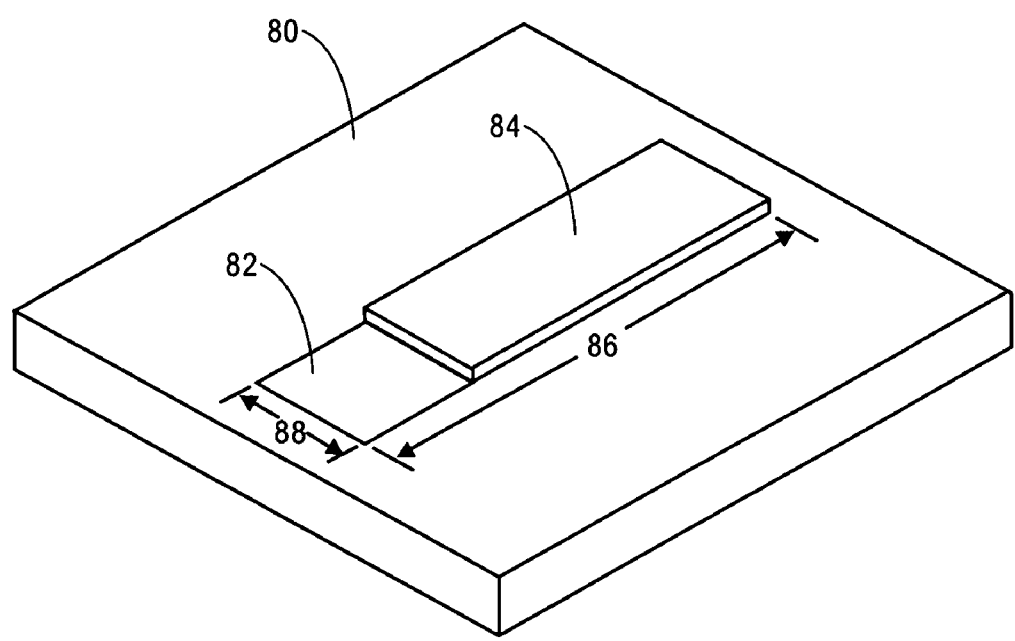
FIG. 6B is a perspective view of the die with a first release film formed thereon.

FIG. 6B illustrates the die 80 with a first release film 84 of photoresist formed thereon. The first release film 84 is patterned into a substantially rectangular shape and is adjacent to one edge of the bonding pad 82. The first release film 84 has a thickness of 0.1 mils. Combined, the bonding pad 82 and the first release film 84 have a length 86 of approximately 14 mils and a width 88 of 2 mils.

Figure 6C:
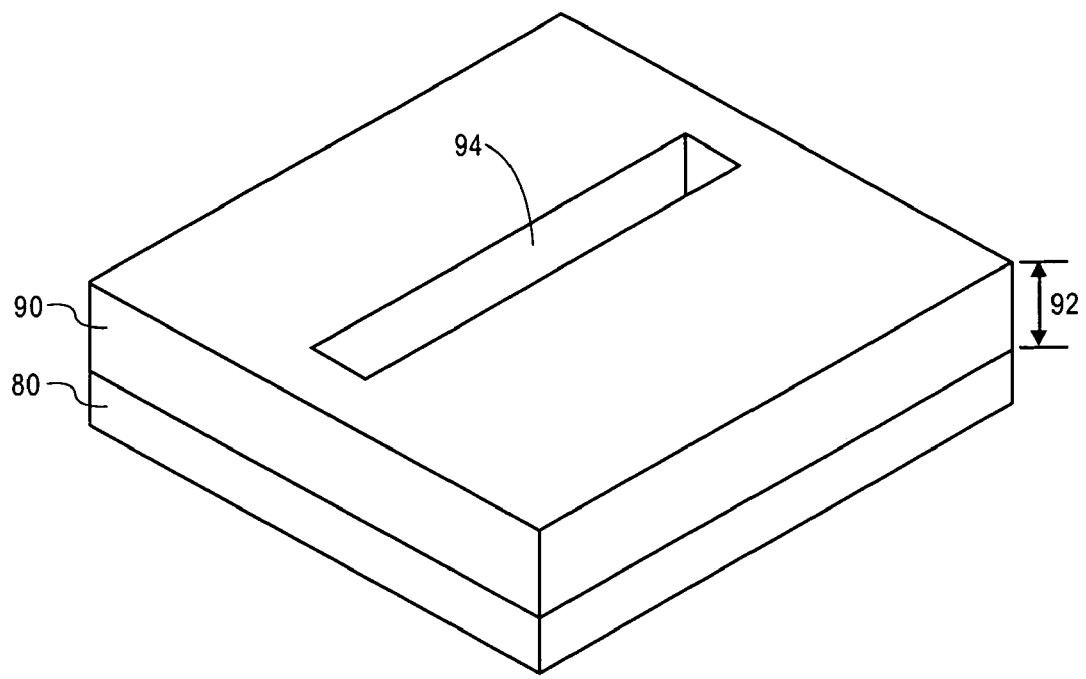
FIG. 6C is a perspective view of the die with a second release film formed thereon.

FIG. 6C illustrates the die 80 with a second release film 90 of photoresist formed thereon with a thickness 92 of 0.5 mils. A first component trench 94 has been formed in the second release film 90 with a length similar to that of the combined length 86 of the bonding pad 82 and the first release film 84 and a width of approximately half the combined width 88 of the bonding pad 82 and the first release film 84 such that approximately one half of the bonding pad 82 and the first release film 84 are now exposed.

Figure 6D:
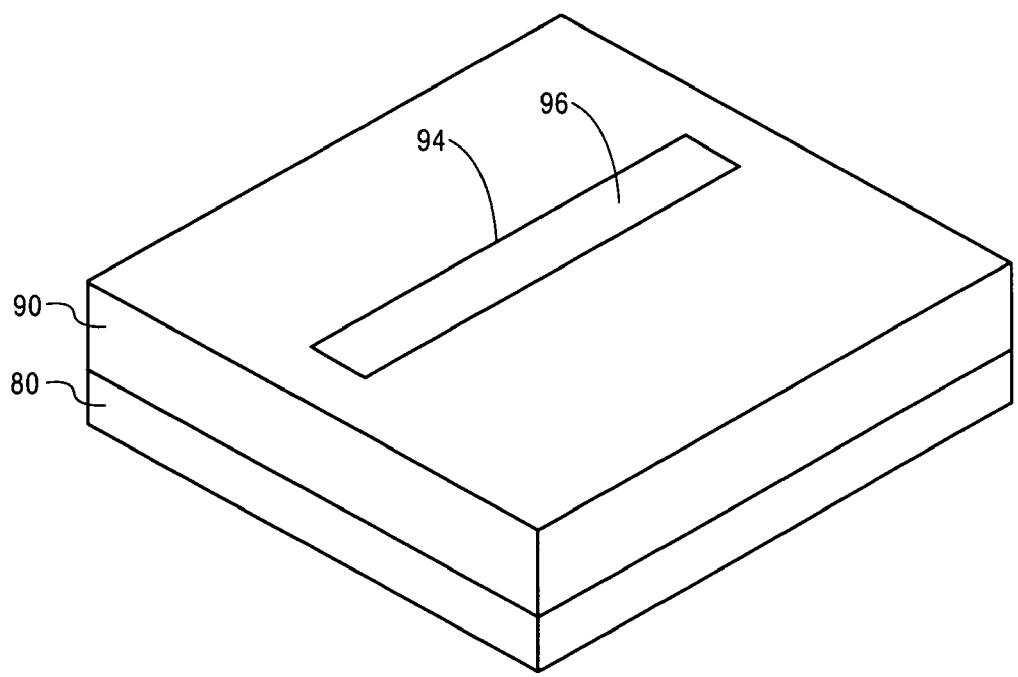
FIG. 6D is a perspective view of the die with a first component formed within the second release film.

FIG. 6D illustrates the die 80 with a first component 96 formed in the first component trench 94. The first component 96 is made of copper and is formed using electroplating. The first component 96 has a size and shape similar to that of the first component trench 94.

Figure 6E:
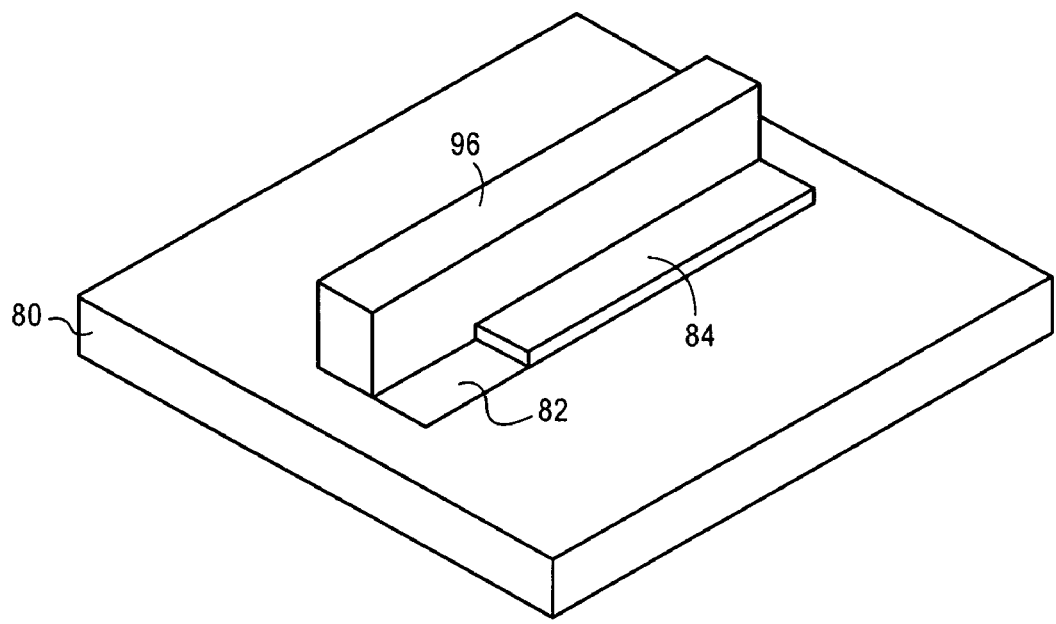
FIG. 6E is a perspective view of the die after the second release film has been removed.

FIG. 6E illustrates the die 80 with the second release film 90 having been removed. The first component 96 and the half of the bonding pad 82 and the first release film 84 that is not covered by the first component 96 are now exposed. The second release film 90 is removed using photolithographic development, as is commonly understood in the art.

Figure 6F:
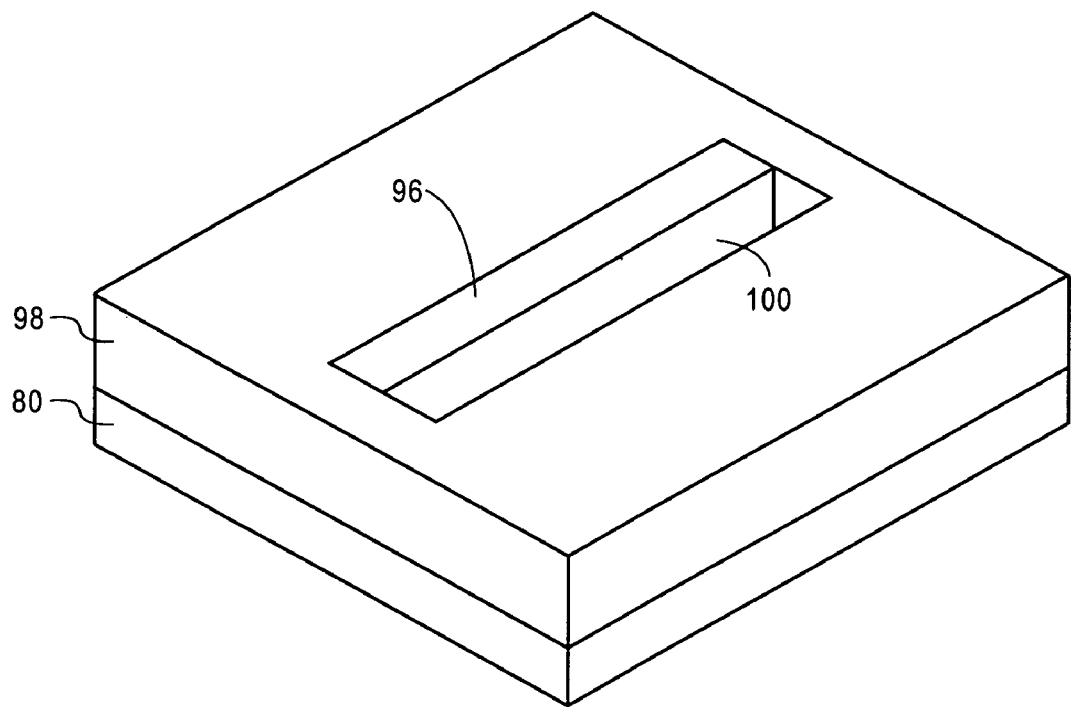
FIG. 6F is a perspective view of the die with a third release film formed thereon.

FIG. 6F illustrates the die 80 with a third release film 98 of photoresist formed thereon. The third release film 98 has a thickness similar to that of the second release film 90 illustrated in FIG. 6D. A second component trench 100 has been formed in the third release film 98 directly over the half of the bonding pad 82 and the first release film 84 that is not covered by the first component 96.

Figure 6G:
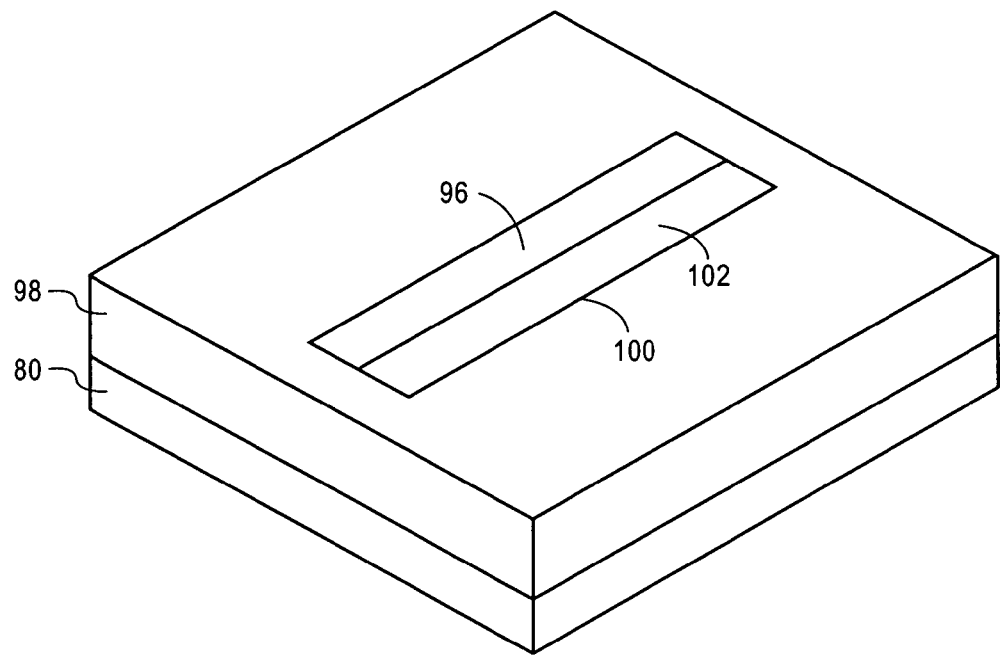
FIG. 6G is a perspective view of the die with a second component formed within the third release film.

FIG. 6G illustrates the die 80 with a second component 102 formed in the second component trench 100, adjacent and connected to the first component 96. The second component 102 is made of aluminum and is formed using electroplating. The second component 102 has a size and shape similar to that of the second component trench 100.

Figure 6H:
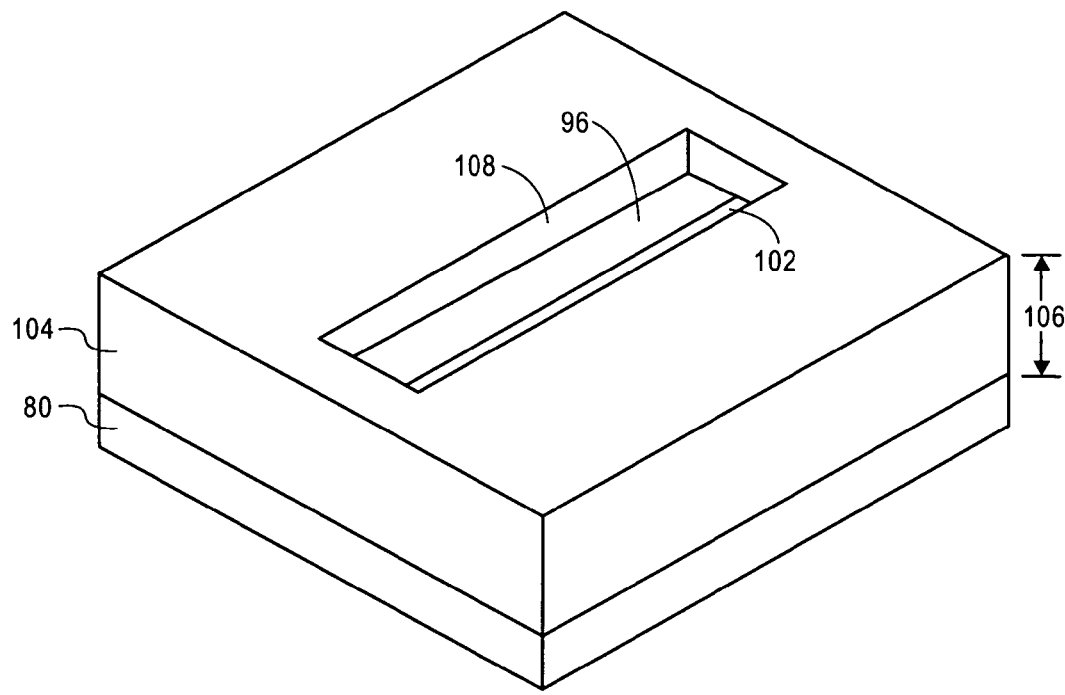
FIG. 6H is a perspective view of the die after the third release film has been removed and replaced with a fourth release film.

FIG. 6H illustrates the die 80 with the third release film 98 having been removed and replaced with a fourth release film 104 of photoresist. The fourth release film 104 has a thickness 106 of 0.75 mils. A third component trench 108 has been formed in the fourth release film 104 directly over the first 96 and second 102 component and has a depth of 0.25 mils.

Figure 6I:
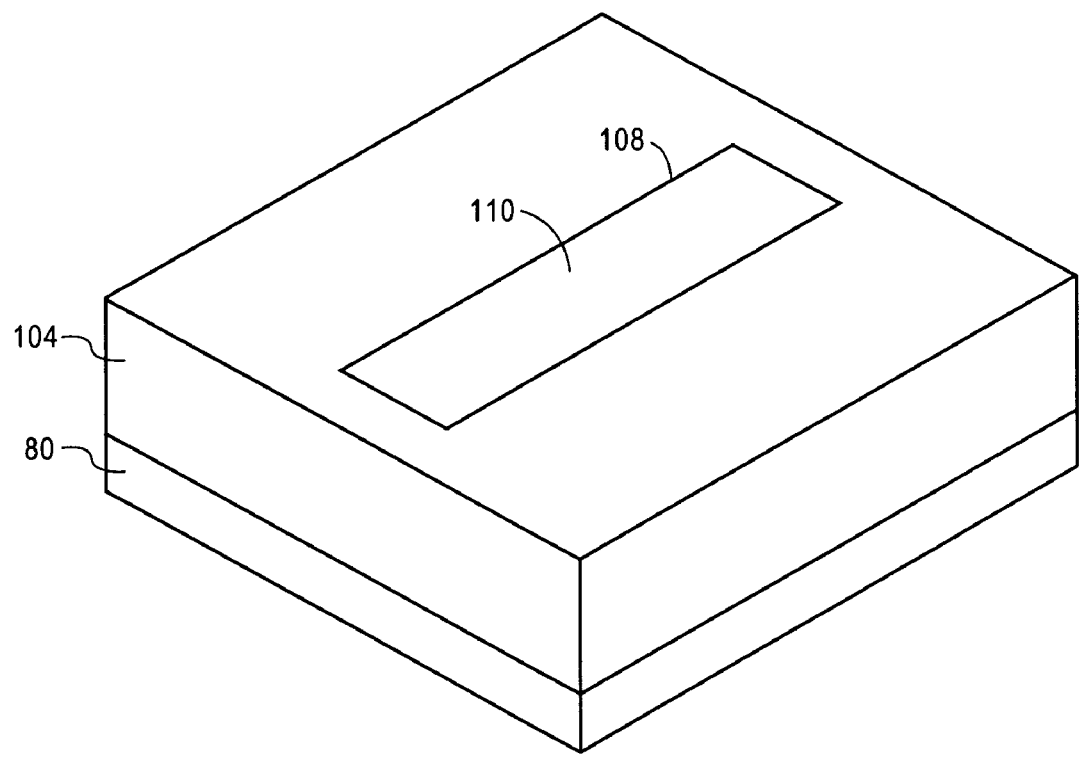
FIG. 6I is a perspective view of the die with a third component formed over the first and second components.

FIG. 6I illustrates the die 80 with a third component 110 formed in the third component trench 108. The third component 110 is made of copper and is formed using electroplating. The third component 110 has a size and shape similar to that of the third component trench 108.

During the formation of the first 96, second 102, and third 110 components, the die 80 is heated, causing stresses to build on the components within the component trenches. The stress is a result of the first 96, second 102, and third 110 components attempted to expand within the component trenches. The amount of stress on the components vary due to the differences in the CTE of the components.

Figure 6J:
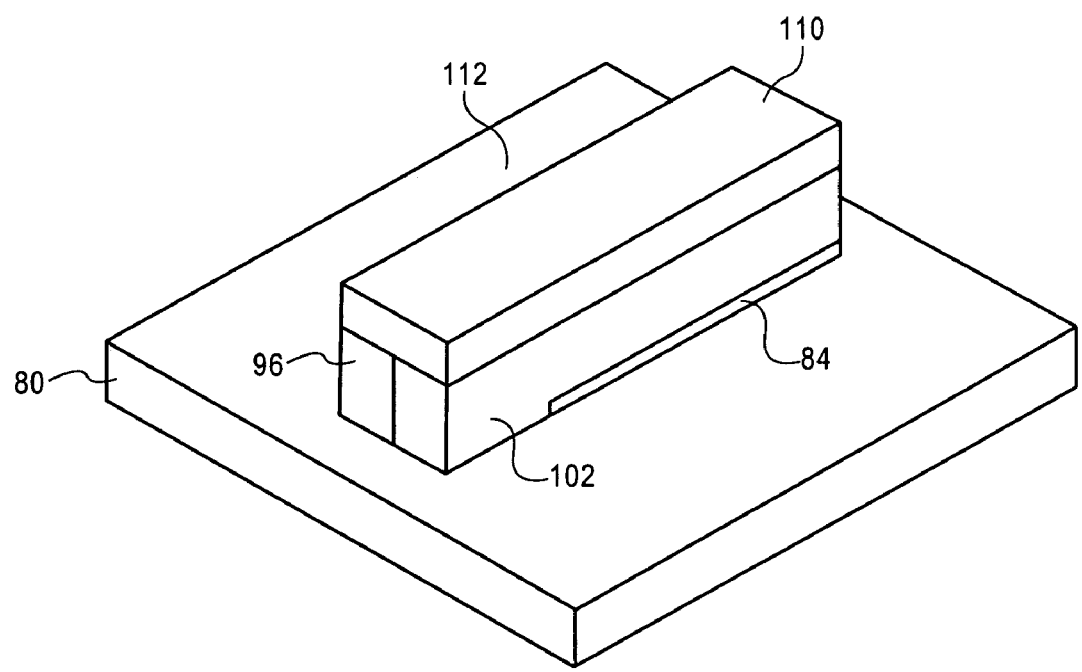
FIG. 6J is a perspective view of the die after the fourth release film has been removed.

FIG. 6J illustrates the die 80 with the fourth release film 104 having been removed. A tri-metal interconnect 112 has been formed from the first 96, second 102, and third 110 components and has a size and shape of the components combined.

Figure 7A:
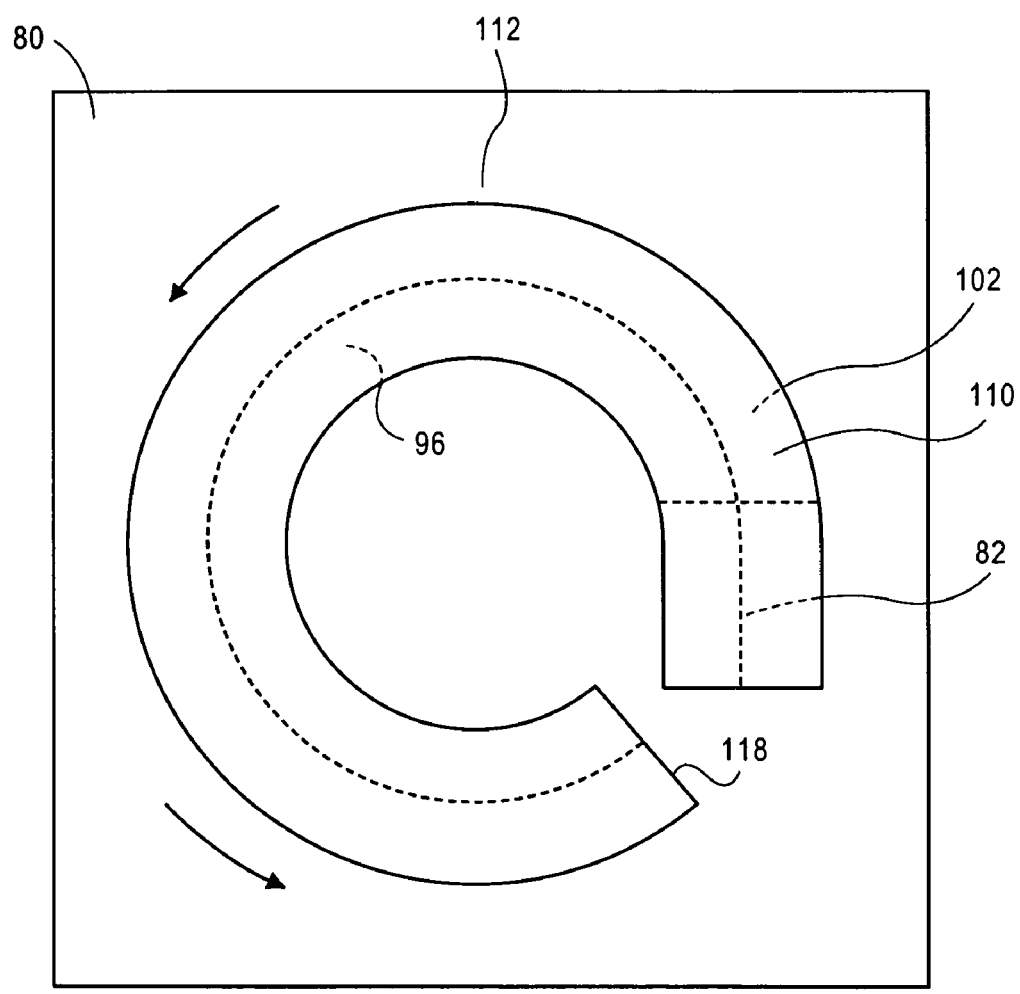
FIG. 7A is a bottom view of the die with a tri-material interconnect formed thereon.
Figure 7B:
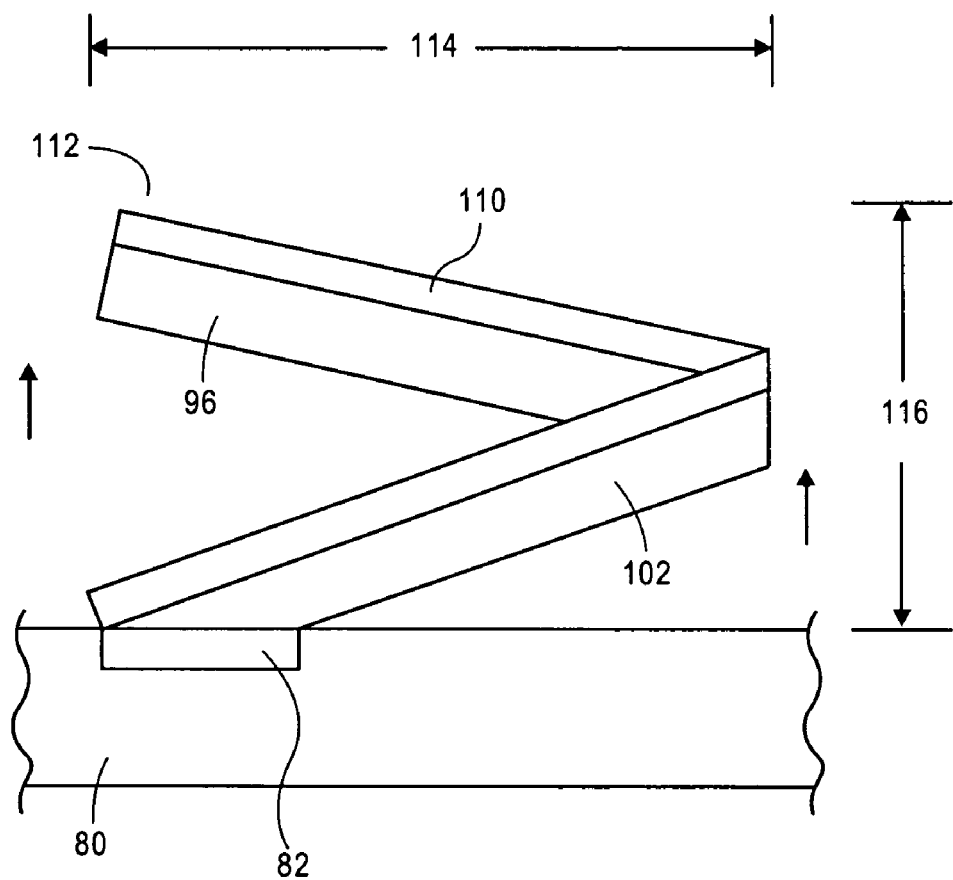
FIG. 7B is a cross-sectional side view of the die of FIG. 7A.

FIGS. 7A and 7B illustrates the die 80 after the first release film 84 has been removed. Because of the stress on the components 96, 102, and 110 created by heating during the formation of the tri-metal interconnect 112, now that the first release film 84 has been removed, the tri-metal interconnect bends in accordance with the same principle described in FIGS. 5A-5C. Therefore, the tri-metal interconnect 112 bends towards the first component 96 as illustrated in FIG. 7A. However, because the third component 110 has a lower CTE than the first 96 and second 102 components combined, the tri-metal interconnect 112 also bends away from the die 80 as illustrated in FIG. 7B.

Referring now to FIG. 7B, the tri-metal interconnect 112 forms a helical structure with a diameter 114 of approximately 8 mils and a height 116 of approximately 6 mils at an end 118 thereof. The tri-metal interconnect 112 is secured to the bonding pad 82 and thus electrically connected to the integrated circuit within the die 80.

Figure 7C:
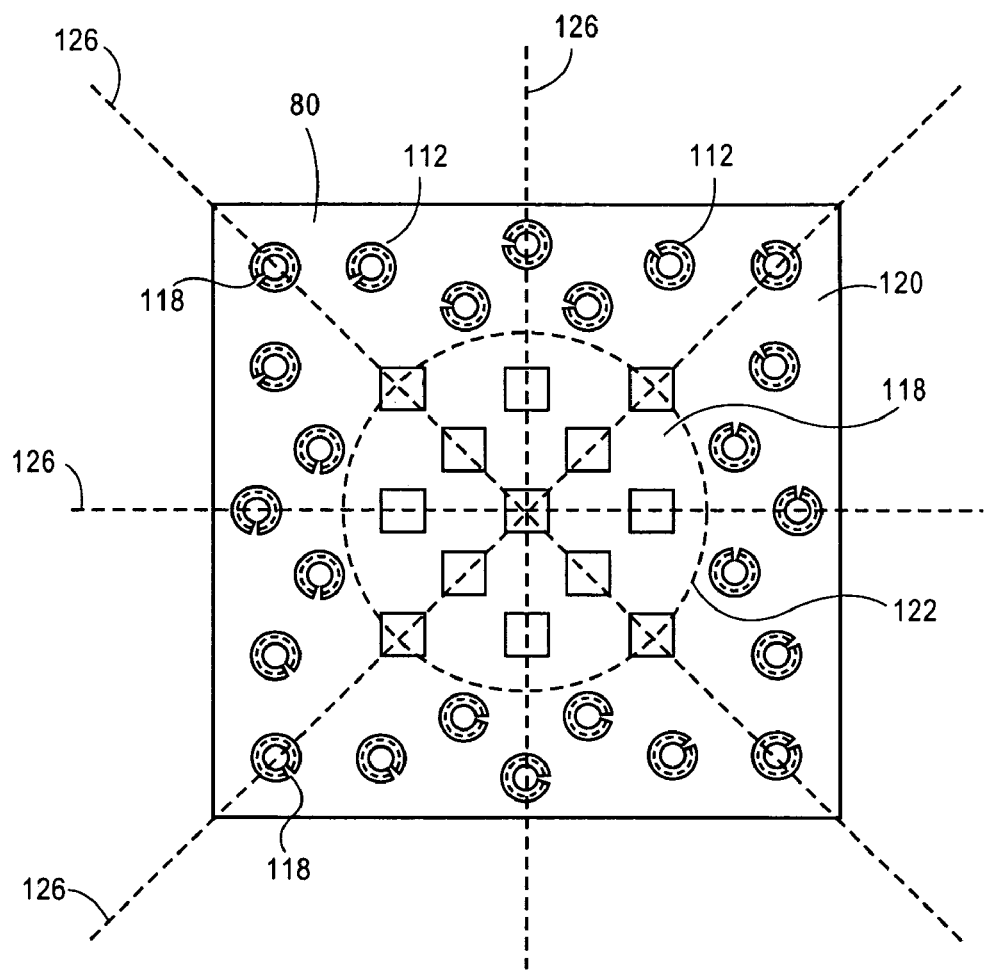
FIG. 7C is a bottom plan view of the die of FIG. 7A.

FIG. 7C illustrates the entire die 80 after the tri-metal interconnects 112 have been attached to a lower surface thereof. Similar to the die 44 illustrated in FIG. 2F, the lower surface of the die 80 includes a first portion 120 and a second portion 122 which are separated by a critical stress radius 124 and represent different levels of mechanical stress on the interconnects while the die 80 is attached to a package substrate during use.

Still referring to FIG. 7C, the tri-metal interconnects 112 are attached to the second portion 122 of the lower surface of the die 80. The tri-metal interconnects 112 are arranged such that the ends 118 of the tri-metal interconnects 112 face in a direction that is substantially parallel to lines 126 extending radially from the critical stress radius 124. Single metal interconnects 128, similar to those illustrated in FIGS. 2F and 5A-5C, have been attached to the first portion 120 of the die 80.

Although not illustrated in detail, the die 80 may be attached to a package substrate and likewise installed on a motherboard similar to those illustrated in FIGS. 3 and 4.

In use, the die 80 and the package substrate to which it is attached work in a similar manner as the die 44 and package substrate 68 illustrated in FIGS. 2F and 5A-5C.

Referring again to FIG. 7C, because of the arrangement of the tri-metal interconnects 112, as the package substrate to which the die 80 is attached expands, the ends 118 of the tri-metal interconnects 112 stretch in a direction that is substantially parallel to lines 126, away from the critical stress radius 124. Likewise, when the package substrate shrinks, the ends 118 of the tri-metal interconnects 112 contract in a direction that is substantially parallel to lines 126, towards the critical stress radius. Therefore, the mechanical stress on the tri-metal interconnects 112 is minimized according to the same principles described in FIGS. 2F and 5A-5C.

One advantage is that because of the stretching and contracting action of the tri-metal interconnects during heating and cooling, the mechanical stress on junctions between the tri-metal interconnects, the die, and the package is reduced and the likelihood of one of the interconnects losing its electrical connection to either the die or the package substrate is reduced. Therefore, a more reliable electronic assembly is provided.

Figure 8A:
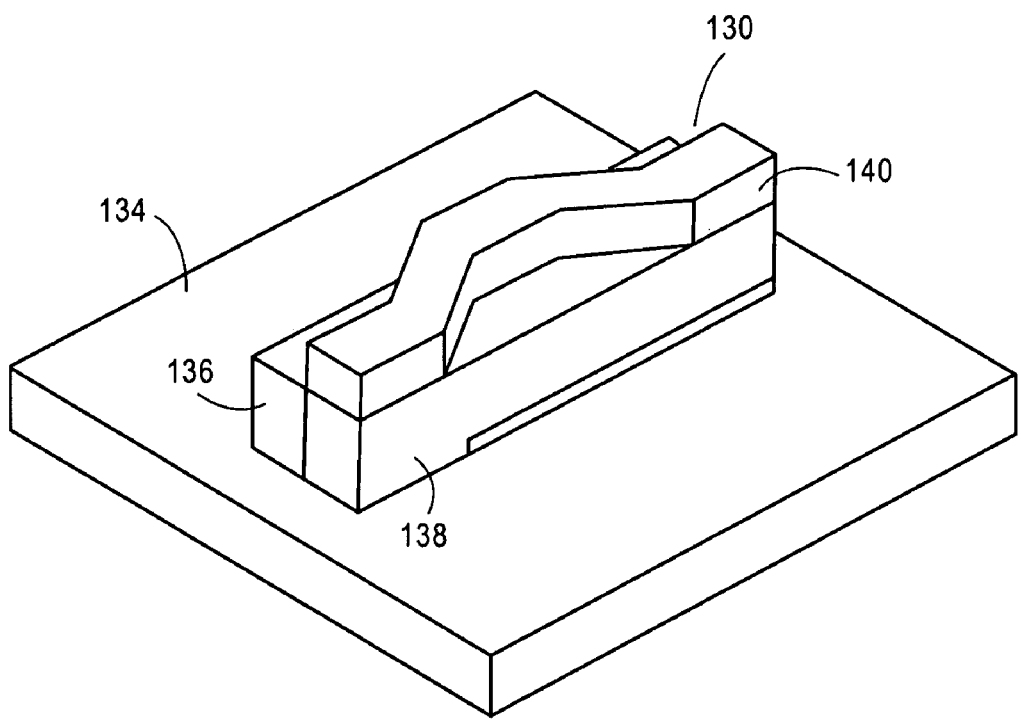
FIGS. 8A and 8B are perspective views of the die of FIG. 7A illustrating alternative embodiments of the tri-material interconnect.
Figure 8B:
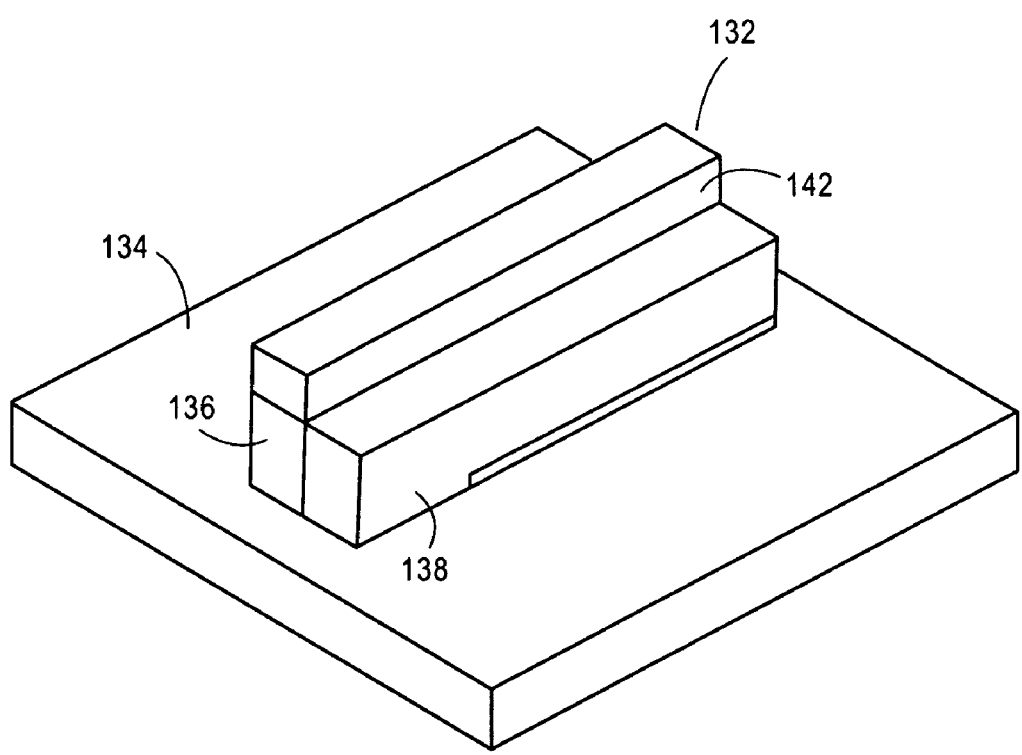

FIGS. 8A and 8B illustrate alternative tri-metal interconnects 130 and 132 having been formed on a die 134, both having similar first 136 and second 138 components. The tri-metal interconnect 130 illustrated in FIG. 8A has a third component 140 is formed over the first 136 and second 138 components such that the third component 140 covers the ends of the second component 138 and a central portion of the first component 136. The tri-metal interconnect 132 illustrated in FIG. 8B has a third component 142 formed over only the first component 136, leaving the second component 138 exposed.

Figure 9:
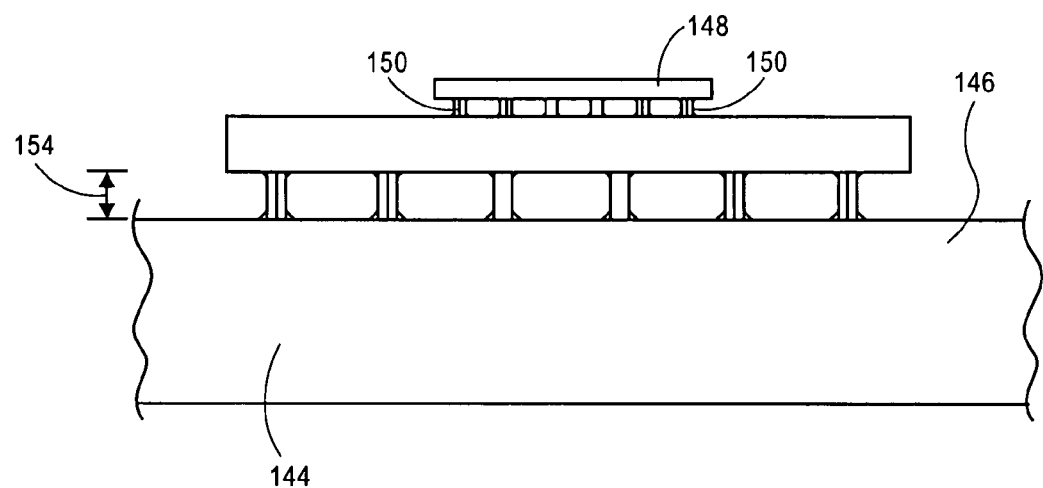
FIG. 9 is a cross-sectional side view of a die, package substrate, and printed circuit board according to an alternative embodiment of the present invention.

FIG. 9 illustrates a printed circuit board 144 with a package substrate 146 and a die 148 attached thereto. The die 148 is connected to the package substrate 146 with interconnects 150 similar to those illustrated in FIGS. 5A-5C. The package substrate 146 is attached to the printed circuit board 144 using interconnects 152 that are also similar to those illustrated in FIGS. 5A-5C, however, the interconnects 152 are larger and have heights 154 of approximately 100 microns. Although not illustrated in detail, it should be understood that the interconnects 152 work in a manner similar to the interconnects illustrated in FIGS. 5A-5C.

Although not illustrated, during the formation of the bi-metal and tri-metal interconnects, an additional layer, such as titanium nickel vanadium (TiNiV), may be formed between the components in order to improve the adhesion between the components. The thickness of this adhesion layer may be such that the sizes and shapes of the interconnects are not appreciably changed.

Other embodiments may use different materials to form the multi-material interconnects, such as electrically conductive plastics and ceramics and other metals such as gold and tungsten. The bi-metal interconnects may be formed directly on a die, in a similar fashion to the tri-metal interconnects, with a second metal component formed directly over a first metal component. The multi-material interconnects may be formed in different cross-sectional shapes besides rectangles, such as spheres and hexagons. The single metal interconnects may be conventional C4 contacts. One or more of the components of the multi-material interconnects may have at least one rounded side. The microelectronic dice may be other types of semiconductor chips besides microprocessors, such as memory chips. The various layers and components made during the formation of the interconnects may be created using typical processes known in the art, such as CVD, sputtering, and electroplating. Any solder deposited during the processes described above may be deposited by other methods, such as spraying, drip dispensation, or through the use of a solder syringe. The package substrate may be attached to the printed circuit board using other types of contact formations, such as Land Grid Arrays and Pin Grid Arrays. The package substrate may also be attached to the printed circuit board with the multi-material interconnects while the die is attached to the package substrate using conventional methods, such as C4 contact formations. All of the various elements and components of the electronic assembly describe above may be made with different dimensions than those described, as is commonly understood in the art.

Figure 10:
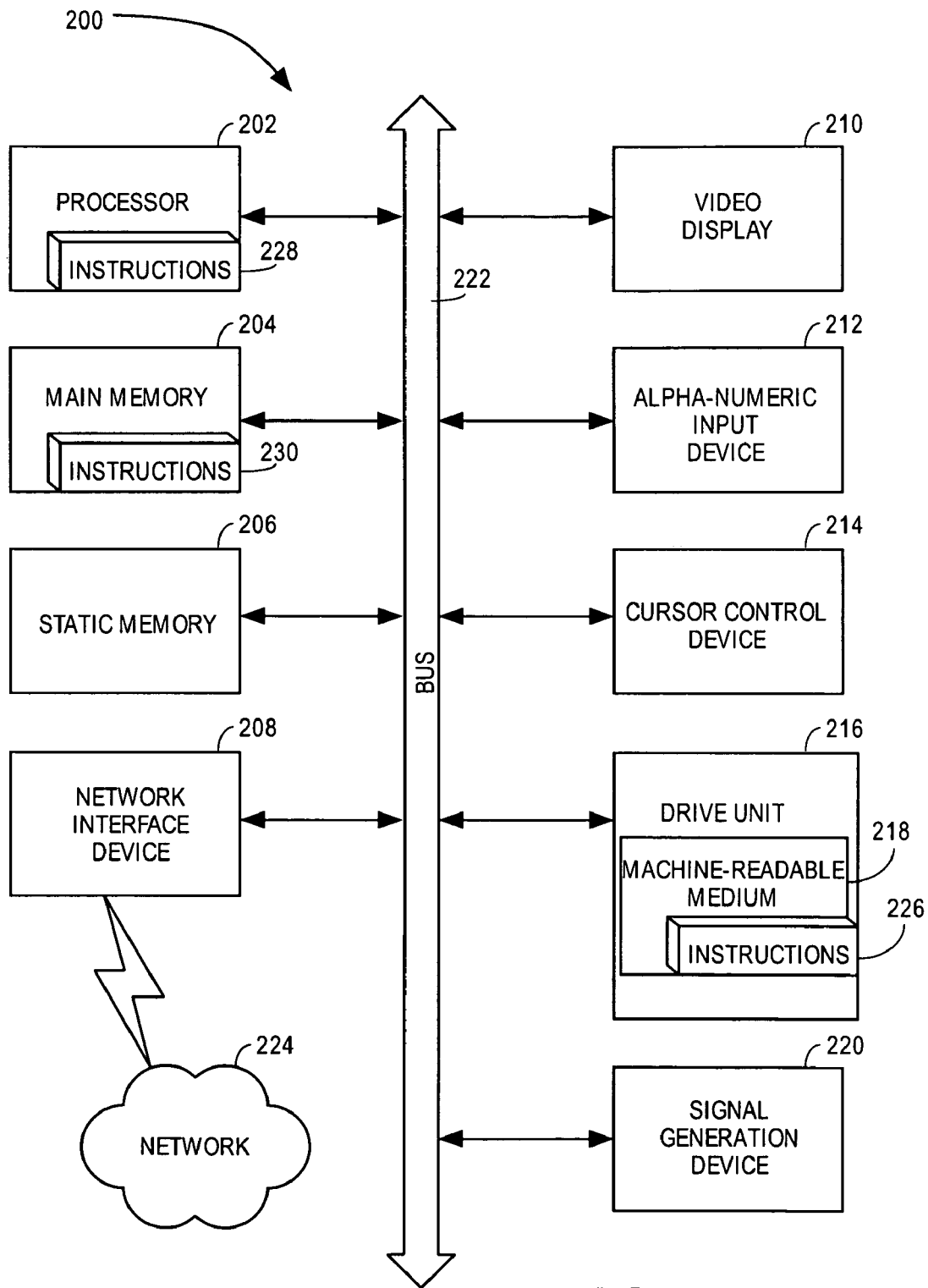
FIG. 10 is a block diagram of a computing system.

FIG. 10 illustrates a computing system 200 into which the dice, packages, and printed circuit boards described above may be installed. The computing system includes a processor 202, a main memory 204, a static memory 206, a network interface device 208, a video display 210, an alpha-numeric input device 212, a cursor control device 214, a drive unit 216 including a machine-readable medium 218, and a signal generation device 220. All of the components of the computing system 200 are interconnected by a bus 222. The computing system 200 may be connected to a network 224 through the network interface device 208.

The machine-readable medium 218 includes a set of instructions 226, which may be partially transferred to the processor 202 and the main memory 204 through the bus 222. The processor 202 and the main memory 204 may also have separate internal sets of instructions 228 and 230.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A method of making an electronic assembly comprising:
    forming a first component from a conductive first material with a first coefficient of thermal expansion;
    forming a second component from second material with a second coefficient of thermal expansion adjacent to the first component, the first and second components jointly forming a bi-material interconnect and being connected and shaped such that when the temperature of the bi-material interconnect changes, the bi-material interconnect bends towards at least one of the first and second component; and
    interconnecting a first substrate having an integrated circuit formed therein and a second substrate with the bi-material interconnect wherein the first and second components are each connected to both the first and second substrates.

2. The method of claim 1, wherein the first substrate has a third coefficient of thermal expansion and the second substrate has a fourth coefficient of thermal expansion, the fourth coefficient of thermal expansion being higher than the third coefficient of thermal expansion.

3. The method of claim 2, wherein when the temperature second substrate increases, the second substrate expands away from a central portion thereof and the interconnect is arranged such that the interconnect bends away from the central portion of the second substrate.

4. The method of claim 3, further comprising interconnecting the central portion of the second substrate and a central portion of the first substrate with a single material interconnect.

5. The method of claim 4, wherein the bi-material interconnect interconnects an outer portion of the first substrate and an outer portion of the second substrate.

* * * * *